US012359302B2

(12) United States Patent
Honma

(10) Patent No.: US 12,359,302 B2
(45) Date of Patent: Jul. 15, 2025

(54) FILM DEPOSITION APPARATUS AND FILM DEPOSITION METHOD

(71) Applicant: Tokyo Electron Limited, Tokyo (JP)

(72) Inventor: Manabu Honma, Iwate (JP)

(73) Assignee: Tokyo Electron Limited, Tokyo (JP)

( * ) Notice: Subject to any disclaimer, the term of this patent is extended or adjusted under 35 U.S.C. 154(b) by 5 days.

(21) Appl. No.: 18/350,179

(22) Filed: Jul. 11, 2023

(65) Prior Publication Data

US 2024/0060170 A1  Feb. 22, 2024

(30) Foreign Application Priority Data

Aug. 17, 2022 (JP) .................................. 2022-130185

(51) Int. Cl.

| | |
|---|---|
| *C23C 14/56* | (2006.01) |
| *C23C 14/24* | (2006.01) |
| *C23C 14/50* | (2006.01) |
| *C23C 14/54* | (2006.01) |
| *C23C 14/58* | (2006.01) |

(52) U.S. Cl.
CPC ............ *C23C 14/24* (2013.01); *C23C 14/505* (2013.01); *C23C 14/54* (2013.01); *C23C 14/568* (2013.01); *C23C 14/5853* (2013.01); *C23C 14/586* (2013.01)

(58) Field of Classification Search
CPC ....... C23C 14/24; C23C 14/505; C23C 14/54; C23C 14/568; C23C 14/5853; C23C 14/586; C23C 16/4412; C23C 16/45519; C23C 16/345; C23C 16/45551; C23C 16/45561; C23C 16/4584; C23C 16/45544; C23C 16/52; H01L 21/6875; H01L 21/68764; H01L 21/68771
USPC ......................... 118/719; 156/345.31, 345.32
See application file for complete search history.

(56) References Cited

U.S. PATENT DOCUMENTS 4,430,149 A * 2/1984 Berkman ............... C30B 25/025
                    118/733
5,105,762 A * 4/1992 Wilkinson ........ H01L 21/67017
                    118/733

(Continued)

FOREIGN PATENT DOCUMENTS

JP     2010-056470     3/2010

*Primary Examiner* — Rudy Zervigon
(74) *Attorney, Agent, or Firm* — IPUSA, PLLC

(57) ABSTRACT

A film deposition apparatus includes a vacuum chamber, a rotary table in the vacuum chamber, and configured to mount multiple substrates along a circumferential direction, a first processing region, a separation region, and a second processing region provided in this order from an upstream side to a downstream side in a rotation direction of the rotary table. A separation gas supply and a third exhaust port are provided in the separation region. The separation gas supply supplies a separation gas to separate a first process gas supplied to the first processing region and a second process gas supplied to the second processing region. The third exhaust port exhausts the separation gas supplied to the separation region. The separation gas supply includes first and second discharge ports provided such that the third exhaust port is between the first and second discharge ports in the circumferential direction of the rotary table.

13 Claims, 9 Drawing Sheets

(56) References Cited

U.S. PATENT DOCUMENTS

| | | | |
|---|---|---|---|
| 2004/0058293 A1* | 3/2004 | Nguyen | H01L 21/6719 432/171 |
| 2015/0194298 A1* | 7/2015 | Lei | H01L 21/02183 438/782 |
| 2016/0068953 A1* | 3/2016 | Li | C23C 16/4412 118/712 |
| 2019/0136377 A1* | 5/2019 | Honma | C23C 16/52 |

* cited by examiner

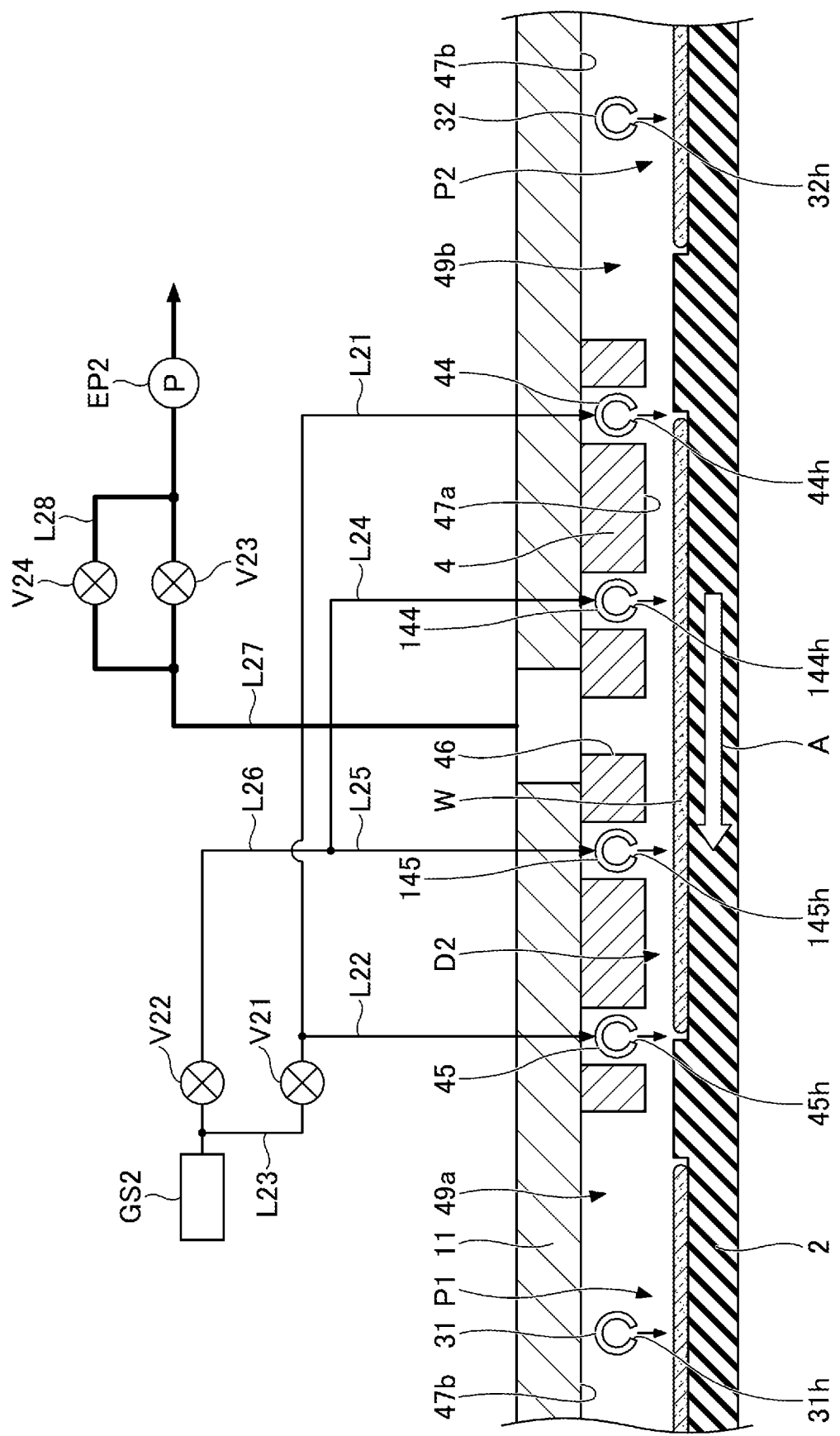

FILM DEPOSITION APPARATUS AND FILM DEPOSITION METHOD

CROSS-REFERENCE TO RELATED APPLICATIONS

This patent application is based on and claims priority to Japanese Patent Application No. 2022-130185 filed on Aug. 17, 2022, the entire contents of which are incorporated herein by reference.

TECHNICAL FIELD

The present disclosure relates to a film deposition apparatus and a film deposition method.

BACKGROUND

A film deposition apparatus including a rotary table provided in a vacuum chamber and configured to mount multiple substrates along a circumferential direction of the rotary table, and two processing regions provided spaced apart from each other via a separation region in the circumferential direction is known (see Patent Document 1, for example).

RELATED ART DOCUMENT

Patent Document

[Patent Document 1] Japanese Laid-open Patent Application Publication No. 2010-56470

SUMMARY

According to one aspect of the present disclosure, a film deposition apparatus includes a vacuum chamber, a rotary table provided in the vacuum chamber, and configured to mount a plurality of substrates along a circumferential direction, a first processing region, a separation region, and a second processing region provided in this order from an upstream side to a downstream side in a rotation direction of the rotary table. A first process gas supply and a first exhaust port are provided in the first processing region, the first process gas supply being configured to supply a first process gas to the substrates, and the first exhaust port being configured to exhaust the first process gas supplied to the substrates. A second process gas supply and a second exhaust port are provided in the second processing region, the second process gas supply being configured to supply a second process gas to the substrates, the second exhaust port being configured to exhaust the second process gas supplied to the substrates. A separation gas supply and a third exhaust port are provided in the separation region, the separation gas supply being configured to supply a separation gas to separate the first process gas supplied to the first processing region and the second process gas supplied to the second processing region from each other, and the third exhaust port being configured to exhaust the separation gas supplied to the separation region. The separation gas supply includes a first discharge port and a second discharge port provided such that the third exhaust port is interposed between the first discharge port and the second discharge port in the circumferential direction of the rotary table, and the separation gas is discharged from the first discharge port and the second discharge port.

BRIEF DESCRIPTION OF THE DRAWINGS

FIG. 9 is another cross-sectional view along the circumferential direction of the film deposition apparatus according to the second embodiment.

DETAILED DESCRIPTION OF EMBODIMENTS

In the following, non-restrictive embodiments of the present disclosure will be described with reference to the accompanying drawings. In all of the accompanying drawings, the same or corresponding members or components are denoted by the same or corresponding reference symbols, and duplicated description is omitted.

First Embodiment (Film Deposition Apparatus)

Figure 1:
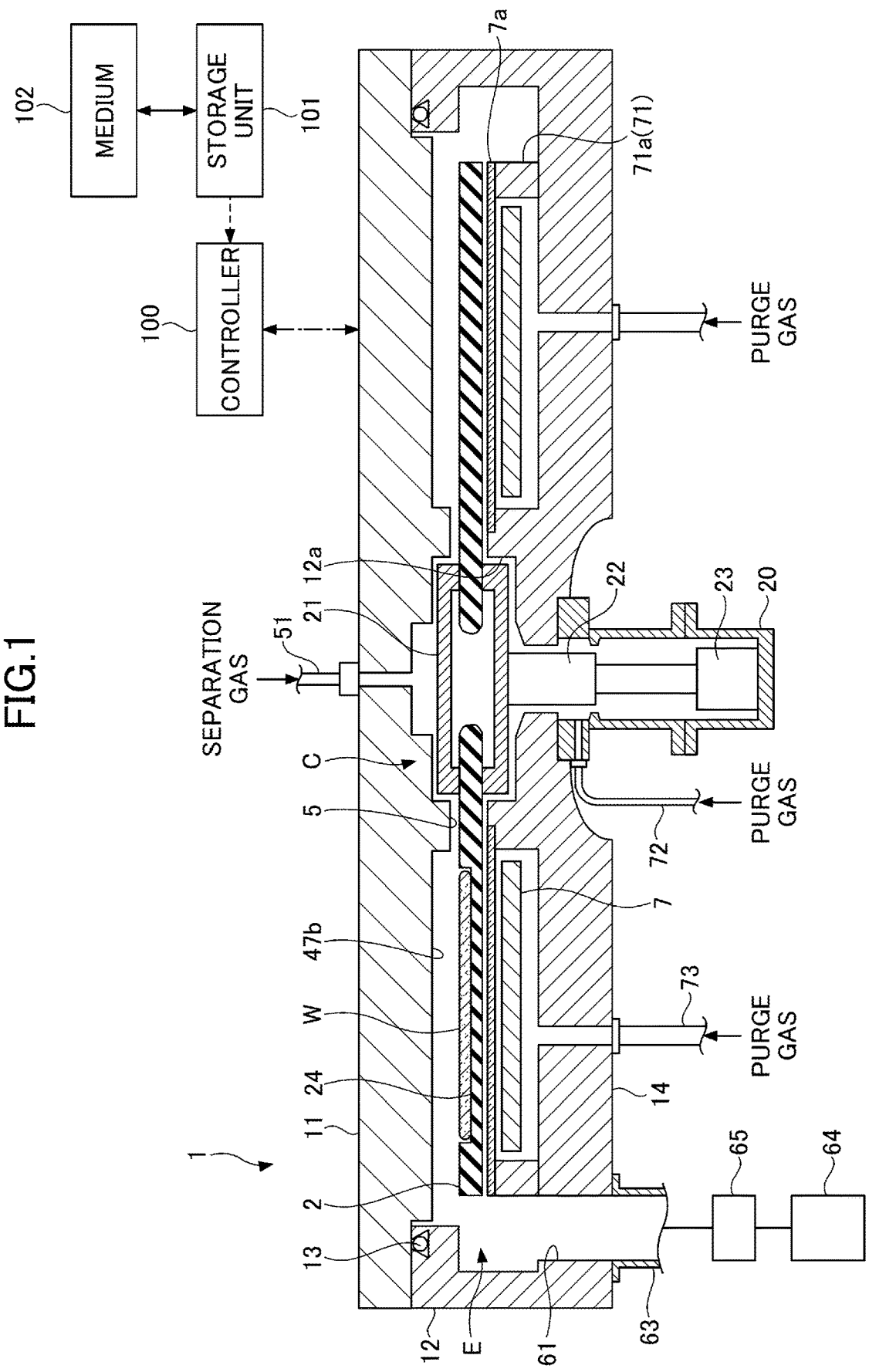
FIG. 1 is a cross-sectional view illustrating a film deposition apparatus according to a first embodiment.
Figure 2:
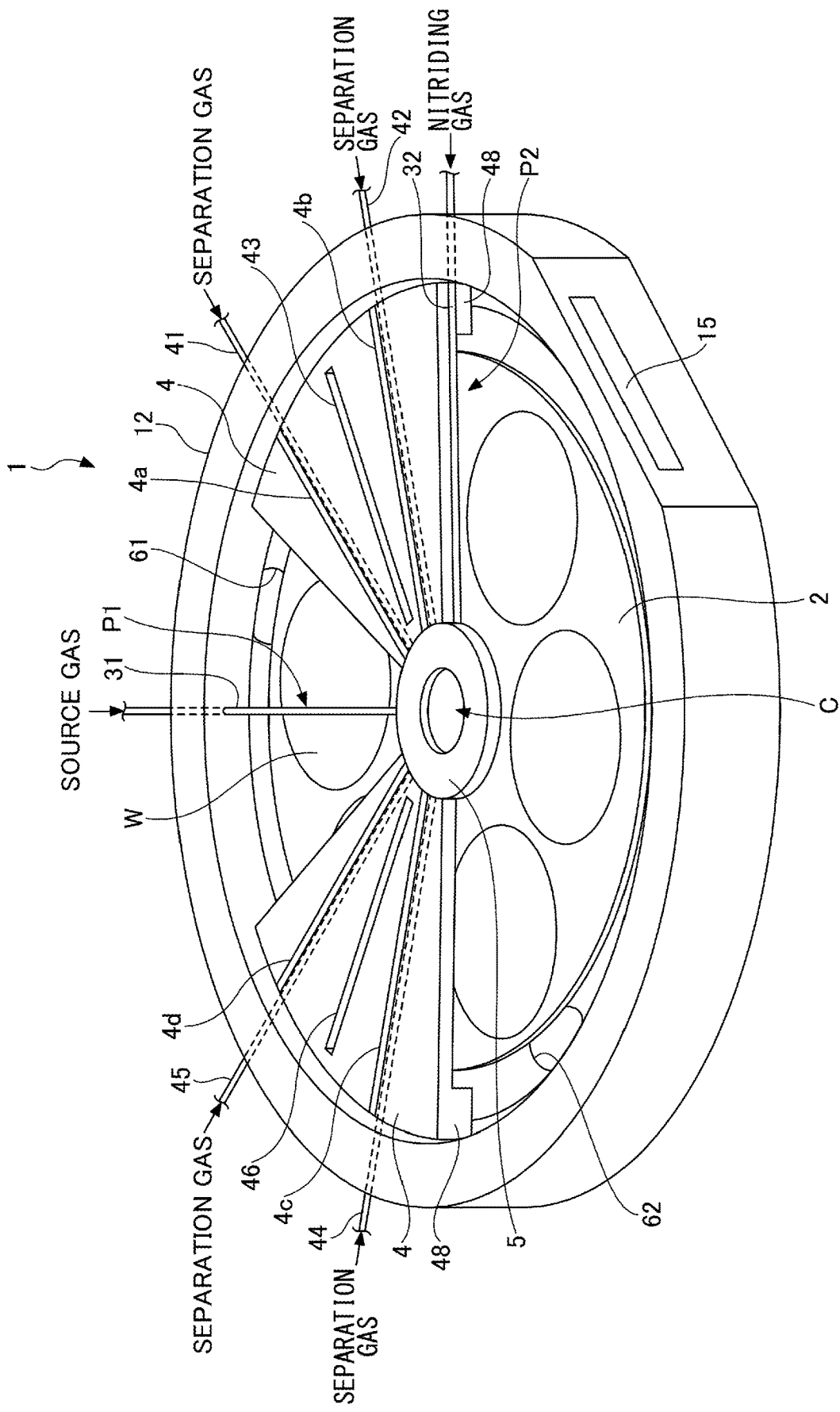
FIG. 2 is a perspective view illustrating a configuration in a vacuum chamber of the film deposition apparatus of FIG. 1.
Figure 3:
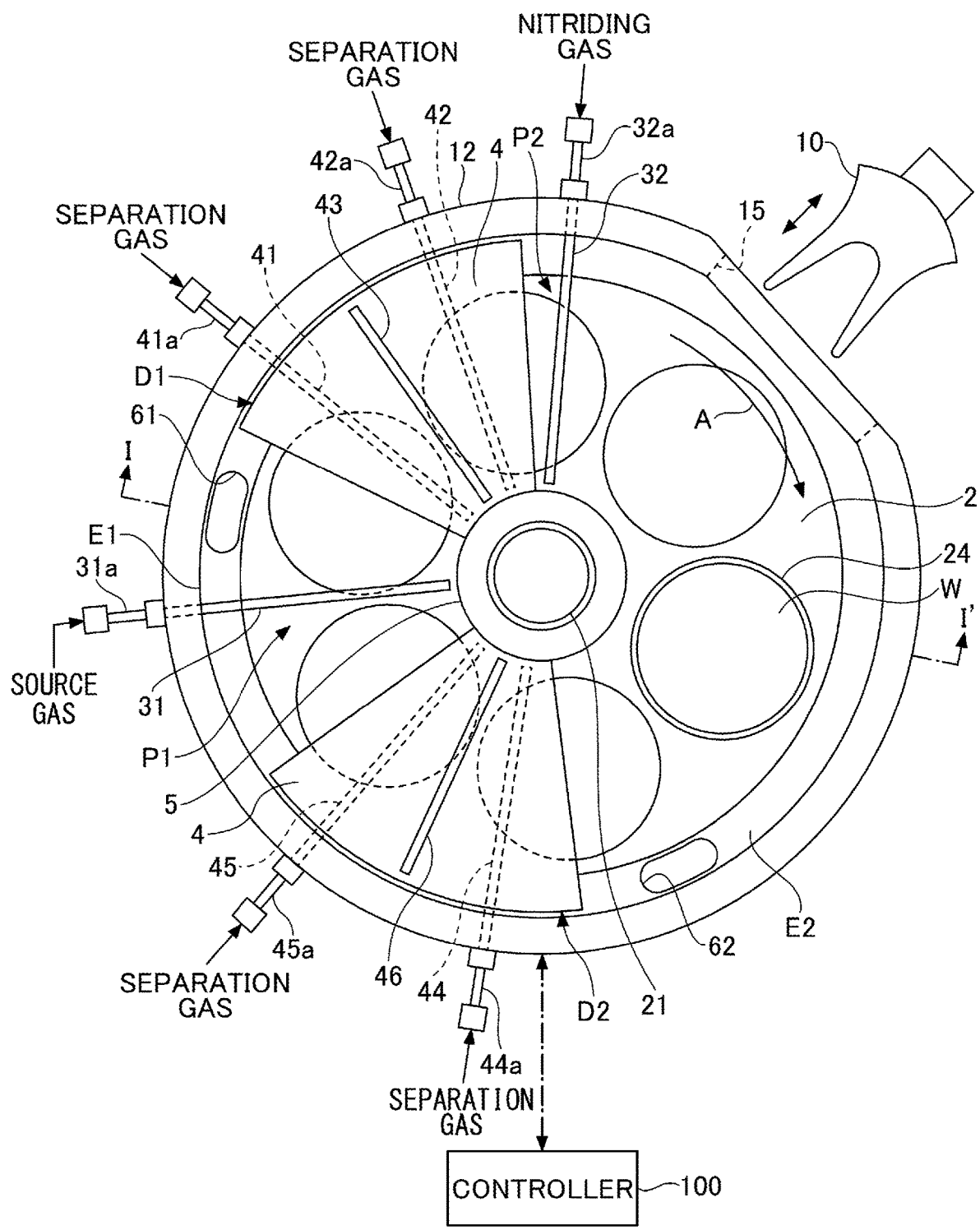
FIG. 3 is a plan view illustrating the configuration in the vacuum chamber of the film deposition apparatus of FIG. 1.

A film deposition apparatus according to a first embodiment will be described with reference to FIGS. 1 to 7. FIG. 1 is a cross-sectional view illustrating the film deposition apparatus according to the first embodiment. FIG. 2 is a perspective view illustrating a configuration in a vacuum chamber of the film deposition apparatus of FIG. 1. FIG. 3 is a plan view illustrating the configuration in the vacuum chamber of the film deposition apparatus of FIG. 1. In FIG. 2 and FIG. 3, a top plate 11 is not illustrated. As illustrated in FIGS. 1 to 3, the film deposition apparatus includes a vacuum chamber 1 and a rotary table 2.

The vacuum chamber 1 is a flat chamber having a substantially circular planar shape. The vacuum chamber 1 includes a chamber body 12 having a cylindrical shape with a bottom, and the top plate 11 airtightly and detachably disposed on an upper surface of the chamber body 12 via a seal member 13 (FIG. 1), such as an O-ring.

The rotary table 2 is provided in the vacuum chamber 1. The rotary table 2 has a rotation center at the center of the vacuum chamber 1. The rotary table 2 is made of, for example, quartz. The rotary table 2 is fixed to a cylindrical core 21 at a central portion thereof. The core 21 is fixed to an upper end of a rotary shaft 22 extending in a vertical direction. The rotary shaft 22 passes through a bottom 14 of the vacuum chamber 1. The lower end of the rotary shaft 22 is attached to a driving section 23 that rotates the rotary shaft 22 around the vertical axis. The rotary shaft 22 and the driving section 23 are accommodated in a cylindrical case 20 whose upper surface is opened. A flange provided on an upper surface of the case 20 is airtightly attached to a lower surface of the bottom 14 of the vacuum chamber 1. This maintains the airtight state of the internal atmosphere of the case 20 with respect to the external atmosphere.

As illustrated in FIG. 2 and FIG. 3, circular recesses 24 for mounting multiple substrates W along a rotational direction (a circumferential direction) are provided on a surface (an upper surface) of the rotary table 2. In the illustrated example, six substrates W are placed in the recesses 24. The substrate W is, for example, a semiconductor wafer. In FIG. 3, the substrate W is illustrated in only one recess 24 for convenience. The recess 24 has an inner diameter slightly greater than the diameter of the substrate W and a depth substantially equal to the thickness of the substrate W. With this configuration, when the substrate W is accommodated in the recess 24, the surface of the substrate W and the surface of the rotary table 2 (a region where the substrate W is not placed) are at the same height. A through-hole (not illustrated), through which, for example, three raising and lowering pins, for supporting the back surface of the substrate W and raising and lowering the substrate W, pass, are formed in the bottom surface of the recess 24.

As illustrated in FIG. 2 and FIG. 3, above the rotary table 2, reactive gas nozzles 31 and 32 and separation gas nozzles 41, 42, 44, and 45 are arranged at intervals in the circumferential direction of the vacuum chamber 1 (the rotational direction of the rotary table 2 indicated by the arrow A in FIG. 3). In the illustrated example, the separation gas nozzles 44 and 45, the reactive gas nozzle 31, the separation gas nozzles 41 and 42, and the reactive gas nozzle 32 are arranged in this order in a clockwise direction (a rotational direction of the rotary table 2) from a transfer port 15, which will be described later. The reactive gas nozzles 31 and 32 and the separation gas nozzles 41, 42, 44, and 45 are made of, for example, quartz. Gas introduction ports 31a, 32a, 41a, 42a, 44a, and 45a (FIG. 3), which are base ends of the reactive gas nozzles 31 and 32 and the separation gas nozzles 41, 42, 44, and 45, are fixed to the outer circumferential wall of the chamber body 12. The reactive gas nozzles 31 and 32 and the separation gas nozzle 41, 42, 44, and 45 are introduced into the vacuum chamber 1 from the outer circumferential wall of the vacuum chamber 1, and are attached to horizontally extend with respect to the rotary table 2 along the radial direction of the chamber body 12.

The reactive gas nozzle 31 is connected to a source gas supply (not illustrated) via a pipe and a flow rate controller (not illustrated). The source gas is, for example, a silicon-containing gas such as dichlorosilane ($SiH_2Cl_2$) gas. The source gas may be a metal-containing gas.

The reactive gas nozzle 32 is connected to a nitriding gas supply source (not illustrated) via a pipe, a flow rate controller, and the like (not illustrated). The nitriding gas is, for example, ammonia ($NH_3$) gas.

Each of the separation gas nozzles 41, 42, 44, and 45 is connected to a separation gas supply source (not illustrated) via a pipe, a flow rate control valve, and the like (not illustrated). The separation gas is, for example, argon (Ar) gas. The separation gas may be $N_2$ gas.

In the reactive gas nozzles 31 and 32, multiple discharge ports 31h and 32h (FIG. 4) opened toward the rotary table 2 are arranged along the longitudinal direction of the reactive gas nozzles 31 and 32 at intervals of, for example, 10 mm. A region below the reactive gas nozzle 31 serves as an adsorption region P1 where the source gas is adsorbed onto the substrate W. A region below the reactive gas nozzle 32 serves as a nitridation region P2 where the source gas adsorbed on the substrate W in the adsorption region P1 is nitrided.

Two protruding portions 4 are provided in the vacuum chamber 1. The protruding portions 4 form separation regions D1 and D2 together with the separation gas nozzles 41, 42, 44, and 45. Therefore, as described later, the protruding portions 4 are attached to the back surface of the top plate 11 so as to protrude toward the rotary table 2. The protruding portion 4 has a fan shape whose top portion is cut in an arc shape as a planar shape. The protruding portion 4 is disposed such that, for example, the inner arc is connected to a protrusion 5 (which will be described later) and the outer arc is along the inner circumferential surface of the chamber body 12.

Figure 4:
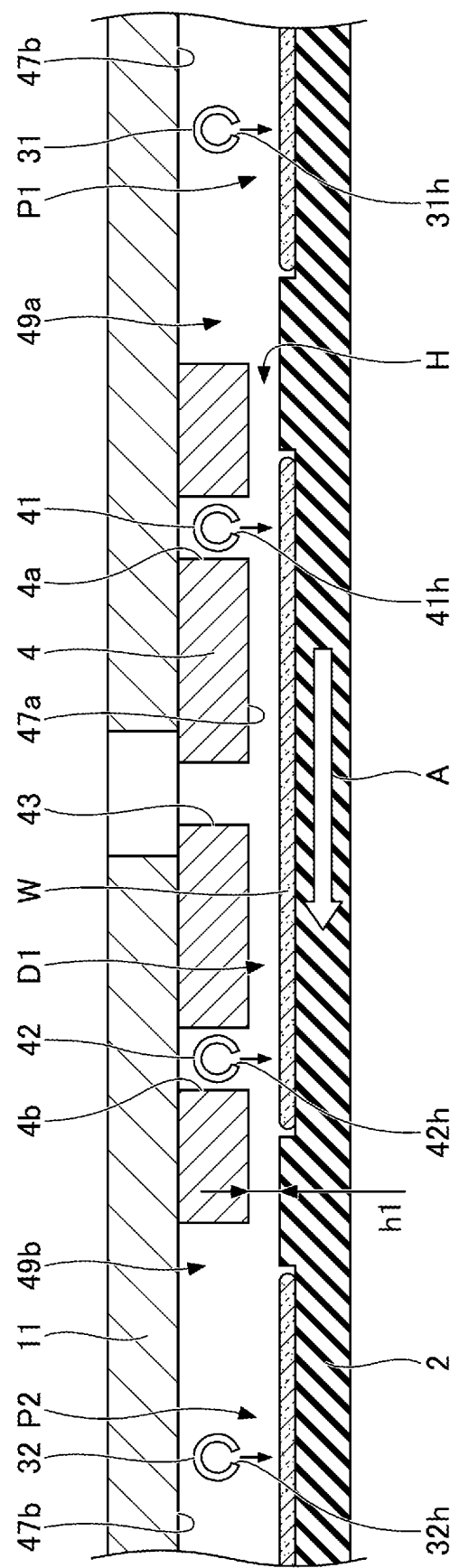
FIG. 4 is a cross-sectional view along a circumferential direction of the film deposition apparatus of FIG. 1.

FIG. 4 illustrates a cross section of the vacuum chamber 1 along a concentric circle of the rotary table 2 from the reactive gas nozzle 31 to the reactive gas nozzle 32. In FIG. 4, the rotational direction of the rotary table 2 is indicated by an arrow A.

As illustrated in FIG. 4, the protruding portion 4 is attached to the back surface of the top plate 11. Therefore, in the vacuum chamber 1, there are a flat low ceiling surface 47a that is the lower surface of the protruding portion 4, and a ceiling surface 47b that is located on both sides of the ceiling surface 47a in the circumferential direction and is higher than the ceiling surface 47a. The ceiling surface 47a has a fan shape whose top portion is cut in an arc shape as a planar shape. The ceiling surface 47a forms a separation space H, which is a narrow space, with respect to the rotary table 2.

Two separation gas nozzles 41 and 42 and one exhaust port 43 are provided in the separation region D1.

The separation gas nozzles 41 and 42 are provided such that the exhaust port 43 is interposed between the separation gas nozzles 41 and 42 in the circumferential direction of the rotary table 2. The separation gas nozzle 41, the exhaust port 43, and the separation gas nozzle 42 are provided in this order from the upstream side to the downstream side in the rotational direction of the rotary table 2. The separation gas nozzle 41 is accommodated in a groove 4a extending along the radial direction on the upstream side of the exhaust port 43 in the rotational direction of the rotary table 2, for example. The separation gas nozzle 42 is accommodated in a groove 4b extending along the radial direction on the downstream side of the exhaust port 43 in the rotational direction of the rotary table 2, for example. The grooves 4a and 4b are formed in the protruding portion 4.

In the separation gas nozzles 41 and 42, multiple discharge ports 41h and 42h, each of which is opened toward the rotary table 2, are provided along the longitudinal direction of the separation gas nozzles 41 and 42 at intervals of, for example, 10 mm. The separation gas nozzles 41 and 42 discharge a separation gas from multiple discharge ports 41h and 42h toward the rotary table 2.

The exhaust port 43 is provided at the center of the protruding portion 4 in the circumferential direction. The exhaust port 43 passes through the protruding portion 4 and the top plate 11. The exhaust port 43 exhausts the separation gas supplied from the separation gas nozzles 41 and 42 to the separation region D1. For example, as illustrated in FIG. 3, the exhaust port 43 has a rectangular shape extending along the radial direction of the rotary table 2 in plan view. In this case, the separation gas is easily exhausted uniformly in the radial direction of the rotary table 2.

Figure 5:
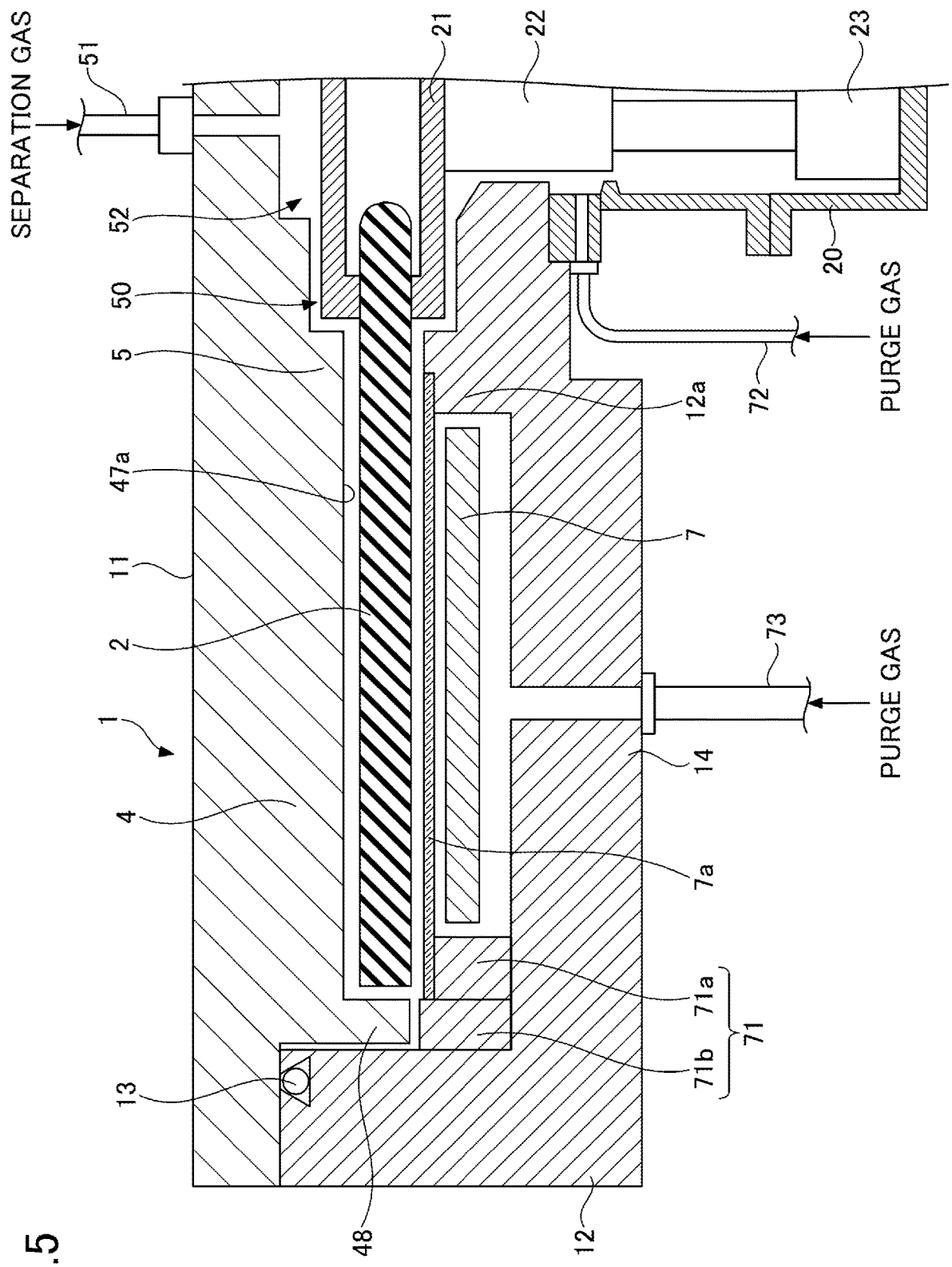
FIG. 5 is a cross-sectional view along a radial direction of the film deposition apparatus of FIG. 1.
Figure 6:
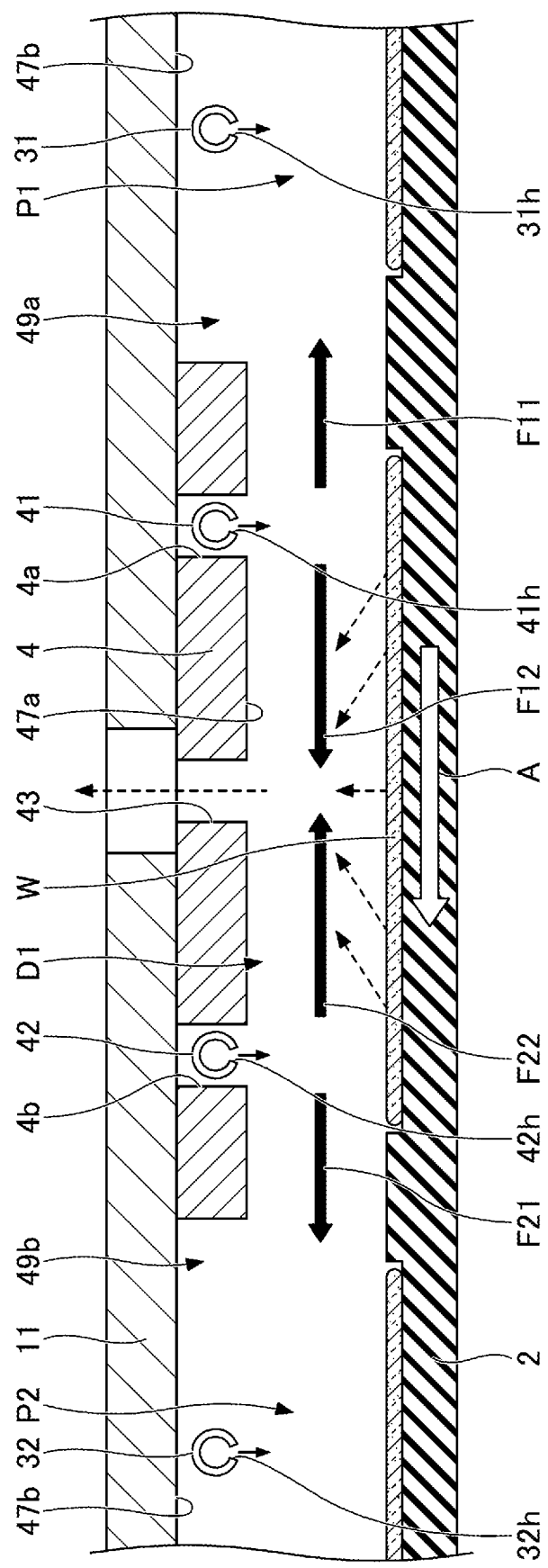
FIG. 6 is a diagram illustrating a flow of a gas in the vacuum chamber of the film deposition apparatus of FIG. 1.

FIG. 6 is a diagram illustrating the flow of the gas in the vacuum chamber 1 of the film deposition apparatus of FIG. 1. In FIG. 6, for convenience of description, the gap between the upper surface of the rotary table 2 and the ceiling surface 47a and the gap between the upper surface of the rotary table 2 and the ceiling surface 47b are illustrated wider than those in FIG. 5.

As illustrated in FIG. 6, when the separation gas is supplied from the discharge port 41h, the separation gas forms a gas flow F11 toward the adsorption region P1 and a gas flow F12 toward the exhaust port 43. The gas flow F11 acts as a counter flow with respect to the source gas from the adsorption region P1. Therefore, the source gas from the adsorption region P1 can be prevented from entering the nitridation region P2. The gas flow F12 guides, among the source gas excessively adsorbed on the surface of the substrate W, a reactive product, and the like (hereinafter referred to as "excessive adsorbed components"), excessive adsorbed components separated from the substrate W between the discharge port 41h and the exhaust port 43 (see broken line arrows), to the exhaust port 43, and exhausts the excessive adsorbed components. Therefore, the amount of the excessive adsorbed components carried into the nitridation region P2 can be reduced. For example, when $SiH_2Cl_2$ gas is used as the source gas and $NH_3$ gas is used as the nitriding gas, the excessive adsorbed components include the $SiH_2Cl_2$ gas, which is the source gas, and HCl, which is the reactive product.

As illustrated in FIG. 6, when the separation gas is supplied from the discharge port 42h, the separation gas forms a gas flow F21 toward the nitridation region P2 and a gas flow F22 toward the exhaust port 43. The gas flow F21 acts as a counter flow to the nitriding gas from the nitridation region P2. Thus, the nitriding gas from the nitridation region P2 can be prevented from entering the adsorption region P1. The gas flow F22 guides, to the exhaust port 43, excessive adsorption components separated from the substrate W between the exhaust port 43 and the discharge port 42h (see broken line arrows) among the excessive adsorption components adsorbed on the surfaces of the substrates W and exhausts the excessive adsorption components. Therefore, the amount of the excessive adsorbed components carried into the nitridation region P2 can be reduced.

The separation gas nozzle 41 is provided, for example, at a position where the exhaust conductance from the discharge port 41h to the exhaust port 43 is less than the exhaust conductance from the discharge port 41h to the end of the separation region D1 that is closer to the adsorption region P1. In this case, the gas flow F11 becomes greater than the gas flow F12. The separation gas nozzle 42 is provided, for example, at a position where the exhaust conductance from the discharge port 42h to the exhaust port 43 is less than the exhaust conductance from the discharge port 42h to the end of the separation region D1 that is closer to the nitridation region P2. In this case, the gas flow F21 becomes greater than the gas flow F22. Therefore, the space separation characteristic in which the source gas from the adsorption region P1 and the nitriding gas from the nitridation region P2 are separated by the separation space H is improved.

Figure 7:
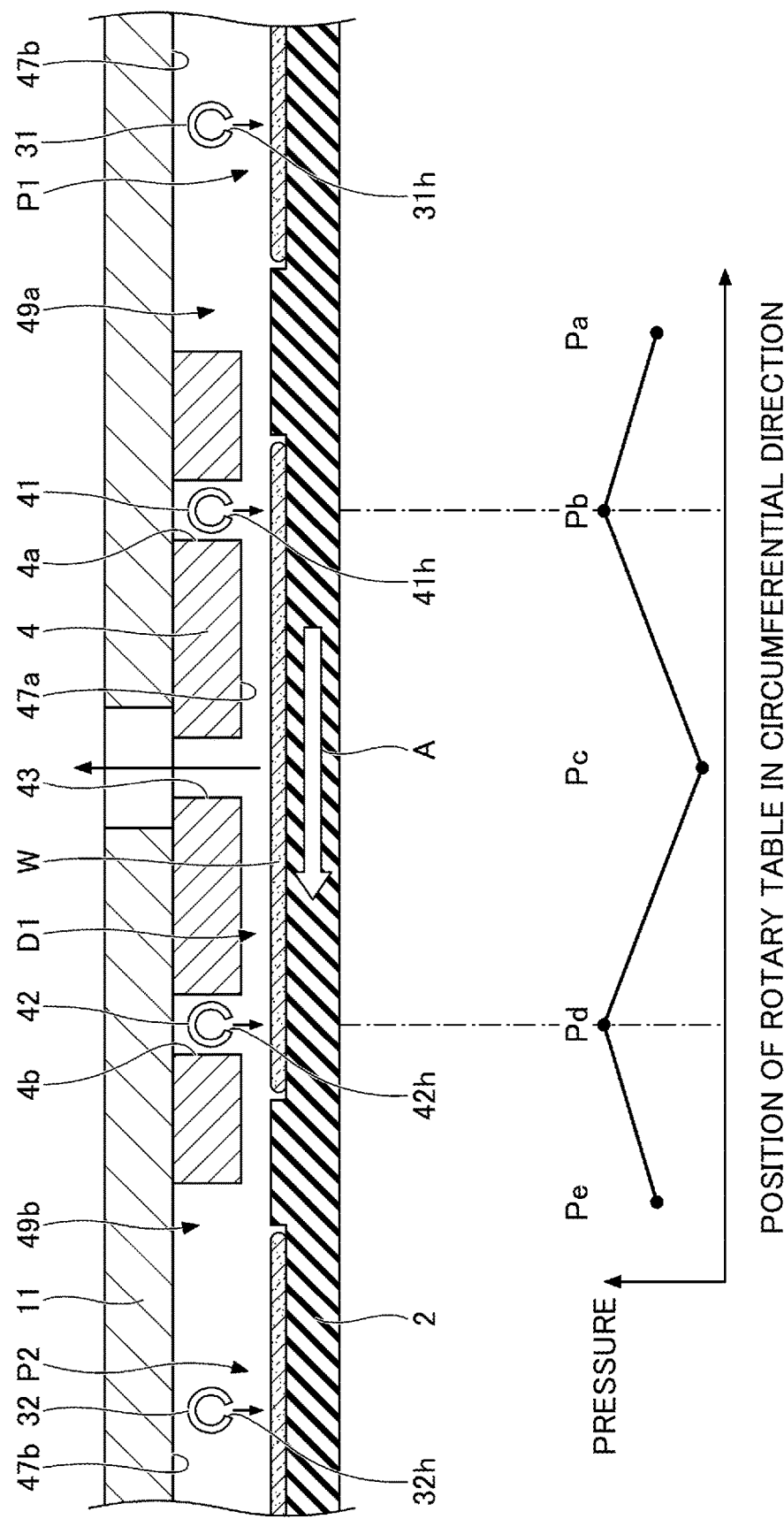
FIG. 7 is a diagram illustrating the pressure in the vacuum chamber of the film deposition apparatus of FIG. 1.

FIG. 7 is a graph illustrating the pressure in the vacuum chamber 1 of the film deposition apparatus illustrated in FIG. 1. In FIG. 7, the pressure in the adsorption region P1 is represented by Pa, the pressure at the position of the discharge port 41h is represented by Pb, the pressure at the position of the exhaust port 43 is represented by Pc, the pressure at the position of the discharge port 42h is represented by Pd, and the pressure in the nitridation region P2 is represented by Pe.

As illustrated in FIG. 7, the pressure Pc at the position where the exhaust port 43 is provided is lower than, for example, the pressure Pa in the adsorption region P1 and the pressure Pe in the nitridation region P2. In this case, the excessive adsorption component adsorbed on the surface of the substrate W is easily exhausted from the exhaust port 43.

As illustrated in FIG. 7, the pressures Pb and Pd at the positions of the discharge ports 41h and 42h are higher than, for example, the pressure Pa in the adsorption region P1, the pressure Pc at the position of the exhaust port 43, and the pressure Pe in the nitridation region P2. In this case, the excessive adsorption components separated from the substrate W between the discharge port 41h and the discharge port 42h is easily prevented from being re-adsorbed to the substrate W.

Here, the separation region D2 may have substantially the same configuration as that of the separation region D1. That is, two separation gas nozzles 44 and 45 and one exhaust port 46 are provided in the separation region D2.

The height h1 of the ceiling surface 47a with respect to the upper surface of the rotary table 2 is set to a height suitable to make the pressures in the separation space H higher than the pressures in spaces 49a and 49b in consideration of the pressure in the vacuum chamber 1 during the film deposition, the rotational speed of the rotary table 2, the flow rate of the separation gas, and the like.

The protrusion 5 (FIG. 2 and FIG. 3) surrounding the outer periphery of the core 21 is provided on the lower surface of the top plate 11. The protrusion 5 is continuous with a portion of the protruding portion 4 on the rotation center side, and the lower surface of the protrusion 5 is formed at the same height as the ceiling surface 47a, for example.

FIG. 1, which is referred to above, is a cross-sectional view taken along the line I-I' in FIG. 3 and illustrates a region where the ceiling surface 47b is provided. FIG. 5 is a cross-sectional view illustrating a region where the ceiling surface 47a is provided. As illustrated in FIG. 5, a bent portion 48 that is bent in an L shape so as to face the outer surface of the end of the rotary table 2 is formed at a peripheral edge of the fan-shaped protruding portion 4 (a portion of the vacuum chamber 1 on the outer edge side). Similar to the protruding portion 4, the bent portion 48 prevents the reactive gas from entering the separation regions D1 and D2 from both sides thereof, and suppresses the mixture of the source gas and the nitriding gas. Because the protruding portion 4 is provided on the top plate 11 and the top plate 11 can be removed from the chamber body 12, there is a slight gap between the outer circumferential surface of the bent portion 48 and the chamber body 12. A gap between the inner circumferential surface of the bent portion 48 and the outer end surface of the rotary table 2 and the gap between the outer circumferential surface of the bent portion 48 and the chamber body 12 are set to, for example, substantially the same size as the height of the ceiling surface 47a with respect to the upper surface of the rotary table 2.

The inner circumferential wall of the chamber body 12 is formed as a vertical surface close to the outer circumferential surface of the bent portion 48 in the separation regions D1 and D2 (FIG. 5), but is recessed outward over an area from a position facing the outer end surface of the rotary table 2 to the bottom 14 in a region other than the separation regions D1 and D2 (FIG. 1). Hereinafter, for convenience of description, the recessed portion having a substantially rectangular cross-sectional shape is referred to as an exhaust region E. Specifically, an exhaust region communicating with the adsorption region P1 is referred to as an exhaust region E1, and a region communicating with the nitridation region P2 is referred to as an exhaust region E2. As illustrated in FIGS. 1 to 3, exhaust ports 61 and 62 are respectively formed at the bottom of the exhaust region E1 and at the bottom of the exhaust region E2. As illustrated in FIG. 1, each of the exhaust ports 61 and 62 is connected to a vacuum pump 64 via an exhaust pipe 63. A pressure controller 65 is provided in the exhaust pipe 63 so that the pressure in the vacuum chamber 1 can be adjusted. Similar to the exhaust port 43, the exhaust ports 61 and 62 may be provided above the rotary table 2, for example, in the top plate 11.

As illustrated in FIG. 1 and FIG. 5, a heater 7 is provided in a space between the rotary table 2 and the bottom 14. The heater 7 heats, by radiation, the substrate W on the rotary table 2 to a temperature determined by a process recipe (for example, 400° C. to 600° C.). An annular cover member 71 is provided below the proximity of the circumferential edge of the rotary table 2 (FIG. 5). The cover member 71 partitions the atmosphere into the atmosphere from the space above the rotary table 2 to the exhaust regions E1 and E2 and the atmosphere in which the heater 7 is placed, to prevent the gas from entering the region below the rotary table 2. The cover member 71 includes an inner member 71a provided so as to face, from below, a lower surface at the outer edge of the rotary table 2 and an area on the outer circumferential side of the outer edge of the rotary table 2, and an outer member 71b provided between the inner member 71a and the inner circumferential surface of the vacuum chamber 1. The outer member 71b is provided below and in proximity to the bent portion 48 formed at the outer edge of the protruding portion 4 in the separation regions D1 and D2. The inner member 71a surrounds the entire circumference of the heater 7 below the outer edge of the rotary table 2 (and below an area slightly outside the outer edge).

The bottom 14 in a portion closer to the rotation center than the space where the heater 7 is disposed protrudes upward so as to approach the core 21 in the vicinity of the center of the lower surface of the rotary table 2 to form a protruding portion 12a. A space formed between the protruding portion 12a and the core 21 is narrow, a gap between the inner circumferential surface of the through hole of the rotary shaft 22 penetrating the bottom 14 and the rotary shaft 22 is narrow, and these narrow spaces communicate with the case 20. A purge gas supply pipe 72 for supplying a purge gas into the narrow space for purging is provided in the case 20. The purge gas is, for example, argon gas. The purge gas may be nitrogen gas. In the bottom 14 of the vacuum chamber 1, multiple purge gas supply pipes 73 for purging the space where the heater 7 is arranged are provided at predetermined angular intervals in the circumferential direction below the heater 7 (one purge gas supply pipe 73 is illustrated in FIG. 5). In order to prevent gas from entering the region where the heater 7 is provided, the cover member 7a is provided between the heater 7 and the rotary table 2 to cover a region between the inner circumferential wall of the outer member 71b (the upper surface of the inner member 71a) and the upper end of the protruding portion 12a in the circumferential direction. The cover member 7a is made of, for example, quartz.

A separation gas supply pipe 51 is connected to a central portion of the top plate 11 of the vacuum chamber 1. The separation gas supply pipe 51 is configured to supply a separation gas to a space 52 between the top plate 11 and the core 21. The separation gas is, for example, argon gas. The separation gas may be nitrogen gas. The separation gas supplied to the space 52 is discharged toward the circumferential edge along the upper surface of the rotary table 2 through the narrow gap 50 between the protrusion 5 and the rotary table 2. The gap 50 can be maintained at a higher pressure than the pressures of the spaces 49a and 49b by the separation gas. With this configuration, the source gas supplied to the adsorption region P1 and the nitriding gas supplied to the nitridation region P2 are prevented from being mixed with each other through the central region C by the gap 50. That is, the gap 50 (or the central region C) functions similarly as the separation space H (or the separation regions D1 and D2).

As illustrated in FIG. 2 and FIGS. 3, a transfer port 15 for transferring the substrate W between an external transfer arm 10 and the rotary table 2 is formed in a side wall of the vacuum chamber 1. The transfer port 15 is opened and closed by a gate valve (not illustrated). Below the rotary table 2, at a position corresponding to the transfer position of the substrate W, a raising/lowering pin (not illustrated) and a raising/lowering mechanism (not illustrated), used for transferring, to pass through the recess 24 to raise the substrate W from the back surface are provided.

As illustrated in FIG. 1, in the film deposition apparatus, a controller 100 including a computer for controlling the operation of the entire apparatus is provided. The memory of the controller 100 stores a program for causing the film deposition apparatus to perform a film deposition method, which will be described below, under the control of the controller 100. The program includes a group of steps to perform the film deposition method, which will be described later. The program is stored in a medium 102 such as a hard disk, a compact disk, a magneto-optical disk, a memory card, or a flexible disk, read into the storage unit 101 by a predetermined reading device, and installed in the controller 100.

According to the film deposition apparatus of the first embodiment, the discharge ports 41h and 42h are provided in the separation region D1 such that the exhaust port 43 is interposed between the discharge ports 41h and 42h in the circumferential direction of the rotary table 2, and the discharge ports 44h and 45h are provided in the separation region D2 such that the exhaust port 46 is interposed between the discharge ports 44h and 45h in the circumferential direction of the rotary table 2. In this case, when a nitride film is formed on the substrate W, discharge and exhaust of the separation gas can be simultaneously performed in the separation region D1, and discharge and exhaust of the separation gas can be simultaneously performed in the separation region D2. Therefore, the mixing of the source gas and the nitriding gas in the vacuum chamber 1 can be suppressed and the carrying of excessive components from one region of the two processing regions (the adsorption region P1 and the nitridation region P2) spaced apart from each other to the other region can be suppressed.

Here, in the film deposition apparatus according to the first embodiment, the case where the source gas, the nitriding gas, and the separation gas are discharged from the gas nozzles has been described, but the present disclosure is not limited thereto. For example, a shower head may be provided instead of the gas nozzles, and the source gas, the nitriding gas, and the separation gas may be discharged from the shower head.

(Film Deposition Method)

A method of depositing a nitride film on the substrate W in the film deposition apparatus according to the first embodiment will be described.

First, the gate valve (not illustrated) is opened, and the substrate W is transferred from the outside into the recess 24 of the rotary table 2 through the transfer port 15 by the transfer arm 10. When the recess 24 stops at a position facing the transfer port 15, the transfer of the substrate W is performed by raising and lowering the raising/lowering pin (not illustrated) from the bottom side of the vacuum chamber 1 through a through-hole in the bottom surface of the recess 24. Such transfer of the substrate W is performed by intermittently rotating the rotary table 2, and the substrate W is placed in each of the six recesses 24 of the rotary table 2.

Next, the gate valve is closed, and the inside of the vacuum chamber 1 is evacuated to a reachable degree of vacuum by the vacuum pump 64. Subsequently, the separation gas is discharged from the separation gas nozzles 41, 42, 44, and 45 and the separation gas supply pipe 51, and the purge gas is discharged from the purge gas supply pipe 72. Additionally, the separation regions D1 and D2 are exhausted through the exhaust ports 43 and 46. Additionally, the inside of the vacuum chamber 1 is controlled to a preset processing pressure by the pressure controller 65. Subsequently, the substrate W is heated to a predetermined temperature by the heater 7 while the rotary table 2 is rotated clockwise.

Next, the source gas is supplied from the reactive gas nozzle 31, and the nitriding gas is supplied from the reactive gas nozzle 32.

By the rotation of the rotary table 2, the substrate W repeatedly passes through the adsorption region P1, the separation region D1, the nitridation region P2, and the separation region D2 in this order. The source gas is adsorbed on the surface of the substrate W in the adsorption region P1, and the source gas adsorbed on the surface of the substrate W is nitrided by the nitriding gas in the nitridation region P2. By repeating such a process, a nitride film having a desired film thickness is formed.

According to the film deposition method of the first embodiment, when the nitride film is formed on the substrate W, the discharge and the exhaust of the separation gas can be simultaneously performed in the separation region D1, and the discharge and the exhaust of the separation gas can be simultaneously performed in the separation region D2. Therefore, the mixing of the source gas and the nitriding gas in the vacuum chamber 1 can be suppressed and the carrying of excessive components from one region of the two processing regions (the adsorption region P1 and the nitridation region P2) spaced apart from each other to the other region can be suppressed.

Second Embodiment (Film Deposition Apparatus)

A film deposition apparatus according to a second embodiment will be described.

Figure 8:
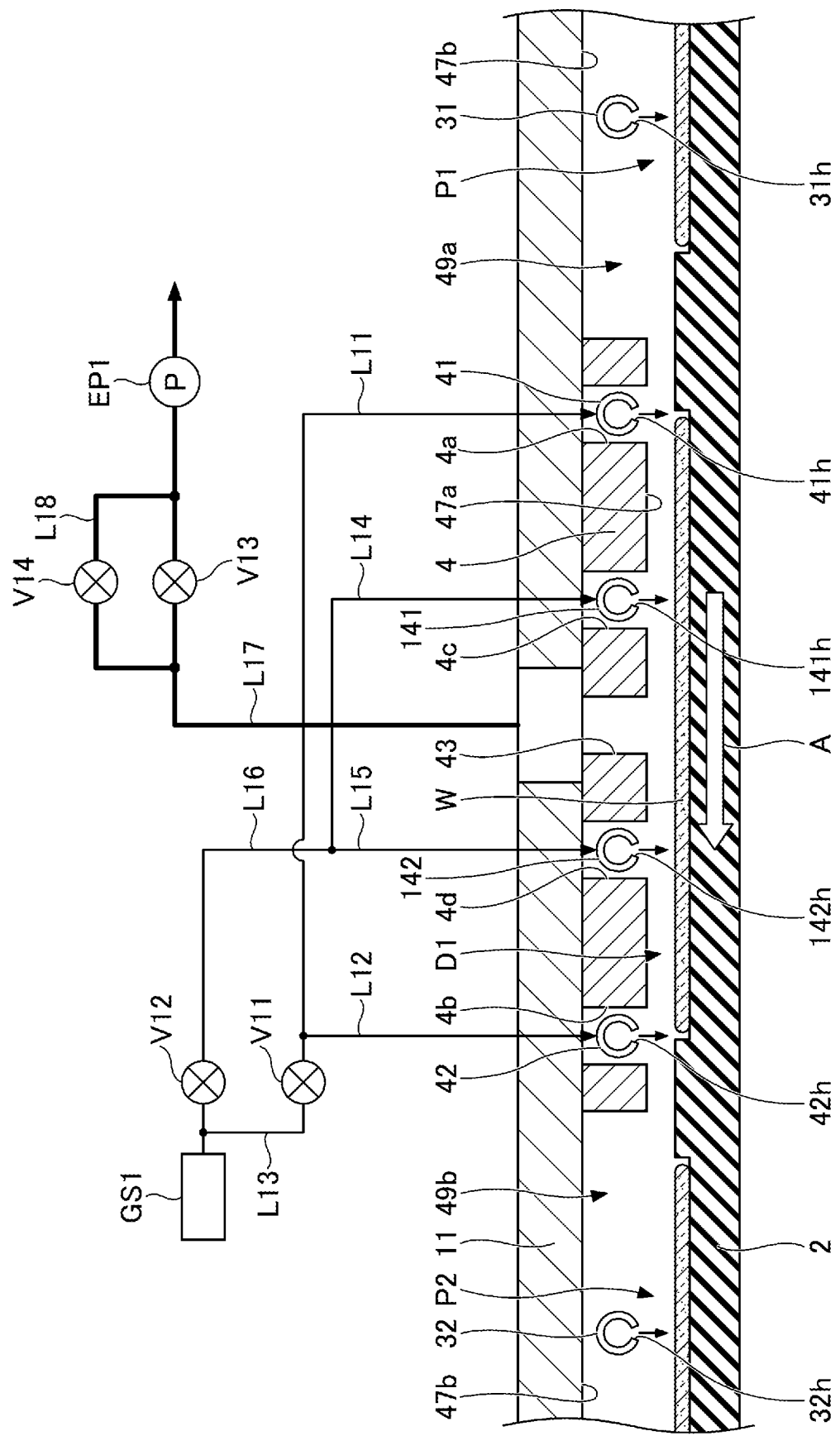
FIG. 8 is a cross-sectional view along a circumferential direction of a film deposition apparatus according to a second embodiment.

FIG. 8 is a cross-sectional view illustrating the film deposition apparatus according to the second embodiment. FIG. 8 illustrates a cross section of the vacuum chamber 1 along a concentric circle of the rotary table 2 from the adsorption region P1 to the nitridation region P2. In FIG. 8, the rotational direction of the rotary table 2 is indicated by the arrow A.

As illustrated in FIG. 8, the film deposition apparatus according to the second embodiment is different from the film deposition apparatus according to the first embodiment in that four separation gas nozzles and one exhaust port are provided in each of the separation regions D1 and D2. The configuration of the film deposition apparatus according to the second embodiment other than the separation regions D1 and D2 may be the same as that of the film deposition apparatus according to the first embodiment. In the following, differences from the film deposition apparatus according to the first embodiment will be mainly described.

Four separation gas nozzles 41, 42, 141, and 142 and one exhaust port 43 are provided in the separation region D1.

The separation gas nozzle 141 is provided between the separation gas nozzle 41 and the exhaust port 43 in the circumferential direction of the rotary table 2. The separation gas nozzle 141 is provided on the downstream side of the separation gas nozzle 41 in the rotational direction of the rotary table 2. The separation gas nozzle 141 is accommodated in, for example, a groove 4c extending along the radial direction of the rotary table 2.

The separation gas nozzle 142 is provided between the exhaust port 43 and the separation gas nozzle 42 in the circumferential direction of the rotary table 2. The separation gas nozzle 142 is provided on the upstream side of the separation gas nozzle 42 in the rotational direction of the rotary table 2. The separation gas nozzle 142 is accommodated in, for example, a groove 4d extending along the radial direction of the rotary table 2.

In the separation gas nozzles 141 and 142, multiple discharge ports 141h and 142h opened toward the rotary table 2 are respectively provided along the longitudinal direction of the separation gas nozzles 141 and 142 at intervals of, for example, 10 mm. The separation gas nozzles 141 and 142 respectively discharge the separation gas from multiple discharge ports 141h and 142h toward the rotary table 2.

The separation gas nozzle 41 is connected to a separation gas source GS1 via separation gas supplying paths L11 and L13. The separation gas nozzle 42 is connected to the separation gas source GS1 via separation gas supplying paths L12 and L13. A valve V11 is provided in the separation gas supplying path L13. The supplying and stopping of the separation gas of the separation gas source GS1 is controlled by the valve V11. The separation gas flows through the separation gas supplying paths L13 and L11 into the separation gas nozzle 41 and is discharged from the discharge port 41h. The separation gas flows through the separation gas supplying paths L13 and L12 into the separation gas nozzle 42 and is discharged from the discharge port 42h. The valve V11 is an example of a supply controller.

The separation gas nozzle 141 is connected to a separation gas source GS1 via separation gas supplying paths L14 and L16. The separation gas nozzle 142 is connected to the separation gas source GS1 via separation gas supplying paths L15 and L16. A valve V12 is provided in the separation gas supplying path L16. The supplying and stopping of the separation gas of the separation gas source GS1 is controlled by the valve V12. The separation gas flows through the separation gas supplying paths L16 and L14 into the separation gas nozzle 141 and is discharged from the discharge port 141h. The separation gas flows through the separation gas supplying paths L16 and L15 into the separation gas nozzle 142 and is discharged from the discharge port 142h. The valve V12 is an example of the supply controller.

A vacuum pump EP1 is connected to the exhaust port 43 via an exhaust path L17. A valve V13 is provided in the exhaust path L17. When the valve V13 is opened, the separation gas supplied to the separation region D1 is exhausted through the exhaust path L17. In the middle of the exhaust path L17, a low-speed exhaust path L18 is connected in parallel with the exhaust path L17. The exhaust conductance of the low-speed exhaust path L18 is less than that of the exhaust path L17. A valve V14 is provided in the low-speed exhaust path L18. When the valve V14 is opened in a state where the valve V13 is closed, the separation gas supplied to the separation region D1 is exhausted through the low-speed exhaust path L18 at an exhaust speed lower than that in the case where the valve V13 is opened. The valves V13 and V14 are examples of an exhaust controller. Here, instead of the valves V13 and V14, the exhaust speed of the separation gas from the exhaust port 43 may be controlled by an automatic pressure control valve.

FIG. 9 illustrates a cross section of the vacuum chamber 1 along a concentric circle of the rotary table 2 from the nitridation region P2 to the adsorption region P1. In FIG. 9, the rotational direction of the rotary table 2 is indicated by the arrow A. As illustrated in FIG. 9, the separation region D2 may have substantially the same configuration as that of the separation region D1. Separation gas nozzle 44, 45, 144, and 145 and the exhaust port 46 are provided in the separation region D2.

The separation gas nozzle 144 is provided between the separation gas nozzle 44 and the exhaust port 46 in the circumferential direction of the rotary table 2. The separation gas nozzle 144 is provided on the downstream side of the separation gas nozzle 44 in the rotational direction of the rotary table 2. The separation gas nozzle 144 is accommodated in, for example, a groove extending along the radial direction of the rotary table 2.

The separation gas nozzle 145 is provided between the exhaust port 46 and the separation gas nozzle 45 in the circumferential direction of the rotary table 2. The separation gas nozzle 145 is provided on the upstream side of the separation gas nozzle 45 in the rotational direction of the rotary table 2. The separation gas nozzle 145 is accommodated in, for example, a groove extending along the radial direction of the rotary table 2.

In the separation gas nozzles 144 and 145, multiple discharge ports 144h and 145h opened toward the rotary table 2 are respectively provided along the longitudinal direction of the separation gas nozzles 144 and 145 at intervals of, for example, 10 mm. The separation gas nozzles 144 and 145 respectively discharge the separation gas from multiple discharge ports 144h and 145h toward the rotary table 2.

The separation gas nozzle 44 is connected to a separation gas source GS2 via separation gas supplying paths L21 and L23. The separation gas nozzle 45 is connected to the separation gas source GS2 via separation gas supplying paths L22 and L23. A valve V21 is provided in the separation gas supplying path L23. The supplying and stopping of the separation gas of the separation gas source GS2 is controlled by the valve V21. The separation gas flows through the separation gas supplying paths L23 and L21 into the separation gas nozzle 44 and is discharged from the discharge port 44h. The separation gas flows through the separation gas supplying paths L23 and L22 into the separation gas nozzle 45 and is discharged from the discharge port 45h. The valve V21 is an example of the supply controller.

The separation gas nozzle 144 is connected to the separation gas source GS2 via separation gas supplying paths L24 and L26. The separation gas nozzle 145 is connected to the separation gas source GS2 via separation gas supplying paths L25 and L26. A valve V22 is provided in the separation gas supplying path L26. The supplying and stopping of the separation gas of the separation gas source GS2 is controlled by the valve V22. The separation gas flows through the separation gas supplying paths L26 and L24 into the separation gas nozzle 144 and is discharged from the discharge port 144h. The separation gas flows through the separation gas supplying paths L26 and L25 into the separation gas nozzle 145 and is discharged from the discharge port 145h. The valve V22 is an example of the supply controller.

A vacuum pump EP2 is connected to the exhaust port 46 via an exhaust path L27. A valve V23 is provided in the exhaust path L27. When the valve V23 is opened, the separation gas supplied to the separation region D2 is exhausted through the exhaust path L27. In the middle of the exhaust path L27, a low-speed exhaust path L28 is connected in parallel with the exhaust path L27. The exhaust conductance of the low-speed exhaust path L28 is less than that of the exhaust path L27. A valve V24 is provided in the low-speed exhaust path L28. When the valve V24 is opened in a state where the valve V23 is closed, the separation gas supplied to the separation region D2 is exhausted through the low-speed exhaust path L28 at an exhaust speed lower than the exhaust speed in the case where the valve V23 is opened. The valves V23 and V24 are examples of the exhaust controller. Here, instead of the valves V23 and V24, the exhaust speed of the separation gas from the exhaust port 46 may be controlled by an automatic pressure control valve.

According to the film deposition apparatus of the second embodiment, the discharge ports 41h and 42h are provided in the separation region D1 such that the exhaust port 43 is interposed between the discharge ports 41h and 42h in the circumferential direction of the rotary table 2, and the discharge ports 44h and 45h are provided in the separation region D2 such that the exhaust port 46 is interposed between the discharge ports 44h and 45h in the circumferential direction of the rotary table 2. In this case, when a nitride film is formed on the substrate W, the discharge and exhaust of the separation gas can be simultaneously performed in the separation region D1, and the discharge and exhaust of the separation gas can be simultaneously performed in the separation region D2. Therefore, the mixing of the source gas and the nitriding gas in the vacuum chamber 1 can be suppressed and the carrying of excessive components from one region of the two processing regions (the adsorption region P1 and the nitridation region P2) spaced apart from each other to the other region can be suppressed.

According to the film deposition apparatus of the second embodiment, two separation gas nozzles 41 and 141 are provided on the upstream side of the exhaust port 43 in the separation region D1 in the rotational direction of the rotary table 2. Additionally, two separation gas nozzles 42 and 142 are provided on the downstream side of the exhaust port 43 in the separation region D1 in the rotational direction of the rotary table 2. In this case, because the supply position of the separation gas can be changed according to the film deposition condition, the balance between the gas replacement capability and the space separation capability in the separation region D1 can be adjusted. The same applies to the separation region D2.

According to the film deposition apparatus of the second embodiment, the exhaust path L17 is connected to the exhaust port 43 in the separation region D1, and in the middle of the exhaust path L17, the low-speed exhaust path L18 is connected in parallel with the exhaust path L17. In this case, because the exhaust speed of the separation gas from the exhaust port 43 can be changed according to the film deposition condition, the balance between the gas replacement capability and the space separation capability in the separation region D1 can be adjusted. The same applies to the separation region D2.

Here, in the film deposition apparatus according to the second embodiment, the case where the source gas, the nitriding gas, and the separation gas are discharged from the gas nozzles has been described, but the present disclosure is not limited thereto. For example, a shower head may be provided instead of the gas nozzles, and the source gas, the nitriding gas, and the separation gas may be discharged from the shower head.

Additionally, in the film deposition apparatus according to the second embodiment, the case where two separation gas nozzles 41 and 141 are provided on the upstream side of the exhaust port 43 in the separation region D1 in the rotational direction of the rotary table 2 has been described, but the present disclosure is not limited thereto. For example, three or more separation gas nozzles may be provided on the upstream side of the exhaust port 43 in the separation region D1 in the rotational direction of the rotary table 2. The same applies to the separation region D2.

Additionally, in the film deposition apparatus according to the second embodiment, the case where two separation gas nozzles 42 and 142 are provided on the downstream side of the exhaust port 43 in the separation region D1 in the rotational direction of the rotary table 2 has been described, but the present disclosure is not limited thereto. For example, three or more separation gas nozzles may be provided on the downstream side of the exhaust port 43 in the separation region D1 in the rotational direction of the rotary table 2. The same applies to the separation region D2.

(Film Deposition Method)

A method of depositing a nitride film on a substrate W in the film deposition apparatus according to the second embodiment will be described.

First, the gate valve (not illustrated) is opened, and the substrate W is transferred from the outside into the recess 24 of the rotary table 2 through the transfer port 15 by the transfer arm 10. When the recess 24 stops at a position facing the transfer port 15, the transfer of the substrate W is performed by raising and lowering a raising/lowering pin (not illustrated) from the bottom side of the vacuum chamber 1 through a through-hole in the bottom surface of the recess 24. Such transfer of the substrate W is performed by intermittently rotating the rotary table 2, and the substrate W is placed in each of the six recesses 24 of the rotary table 2.

Next, the gate valve is closed, and the inside of the vacuum chamber 1 is evacuated to a reachable degree of vacuum by the vacuum pump 64.

Subsequently, by closing the valve V11 and opening the valve V12, the separation gas is not discharged from the discharge ports 41h and 42h, and the separation gas is discharged from the discharge ports 141h and 142h. Additionally, by closing the valve V22 and opening the valve V21, the separation gas is not discharged from the discharge ports 144h and 145h, and the separation gas is discharged from the discharge ports 44h and 45h. Further, the separation gas is discharged from the separation gas supply pipe 51, and the purge gas is discharged from the purge gas supply pipe 72.

Additionally, by closing the valves V13 and V14, the exhaust of the separation gas from the exhaust port 43 is stopped. However, by closing the valve V13 and opening the valve V14, the separation gas may be exhausted from the exhaust port 43 at a low speed. Additionally, by closing the valve V24 and opening the valve V23, the separation gas is exhausted from the exhaust port 46 at a high speed.

The inside of the vacuum chamber 1 is controlled to a preset processing pressure by the pressure controller 65. Subsequently, the substrate W is heated to a predetermined temperature by the heater 7 while the rotary table 2 is rotated clockwise.

Next, the source gas is supplied from the reactive gas nozzle 31, and the nitriding gas is supplied from the reactive gas nozzle 32.

By the rotation of the rotary table 2, the substrate W repeatedly passes through the adsorption region P1, the separation region D1, the nitridation region P2, and the separation region D2 in this order. The source gas is adsorbed on the surface of the substrate W in the adsorption region P1, and the source gas adsorbed on the surface of the substrate W in the nitridation region P2 is nitrided by the nitriding gas. By repeating such a process, a nitride film having a desired film thickness is formed.

According to the film deposition method of the second embodiment, when the nitride film is formed on the substrate W, the separation gas is discharged from the discharge ports 141h and 142h in the separation region D1 and the exhaust of the separation gas from the exhaust port 43 is stopped. In this case, because the pressure in the separation space H of the separation region D1 becomes high, the space separation characteristic for separating the source gas and the nitriding gas in the separation region D1 is improved.

According to the film deposition method of the second embodiment, when the nitride film is formed on the substrate W, the separation gas is discharged from the discharge ports 44h and 45h in the separation region D2 and the separation gas is exhausted from the exhaust port 46 at a high speed. In this case, because the exhaust characteristic in the separation region D2 is improved, the amount of the excessive adsorbed components carried into the adsorption region P1 from the nitridation region P2 can be reduced.

It should be understood that the embodiments disclosed herein are illustrative in all respects and are not restrictive. Omission, substitution, and modification may be made on the above-described embodiments in various forms without departing from the scope and spirit of the appended claims.

Although the case where the reactive gas nozzle 32 is connected to the nitriding gas supply source has been described in the above-described embodiments, the present disclosure is not limited thereto. For example, the reactive gas nozzle 32 may be connected to an oxidizing gas supply source. In this case, a region below the reactive gas nozzle 32 serves as an oxidation region where the source gas adsorbed on the substrate W in the adsorption region P1 is oxidized. The oxidizing gas is, for example, ozone ($O_3$) gas.

According to the present disclosure, the carrying of excessive components from one region of two processing regions spaced apart from each other to the other region can be suppressed.

What is claimed is:

1. A film deposition apparatus comprising:
    a vacuum chamber;
    a rotary table provided in the vacuum chamber, and configured to mount a plurality of substrates along a circumferential direction; and
    a first processing region, a separation region, and a second processing region provided in this order from an upstream side to a downstream side in a rotation direction of the rotary table,
    wherein a first process gas supply and a first exhaust port are provided in the first processing region, the first process gas supply being configured to supply a first process gas to the substrates, and the first exhaust port being configured to exhaust the first process gas supplied to the substrates,
    wherein a second process gas supply and a second exhaust port are provided in the second processing region, the second process gas supply being configured to supply a second process gas to the substrates, the second exhaust port being configured to exhaust the second process gas supplied to the substrates, wherein a separation gas supply and a third exhaust port are provided in the separation region, the separation gas supply being configured to supply a separation gas to separate the first process gas supplied to the first processing region and the second process gas supplied to the second processing region from each other, and the third exhaust port being configured to exhaust the separation gas supplied to the separation region, wherein the separation gas supply includes a first discharge port and a second discharge port provided such that the third exhaust port is interposed between the first discharge port and the second discharge port in the circumferential direction of the rotary table, and the separation gas is discharged from the first discharge port and the second discharge port, wherein the first discharge port, the third exhaust port, and the second discharge port are provided in this order from the upstream side to the downstream side in the rotation direction of the rotary table, wherein an exhaust conductance from the first discharge port to the third exhaust port is less than an exhaust conductance from the first discharge port to a first end of the separation region, the first end being close to the first processing region, and wherein an exhaust conductance from the second discharge port to the third exhaust port is less than an exhaust conductance from the second discharge port to a second end of the separation region, the second end being close to the second processing region.

2. The film deposition apparatus as claimed in claim 1, wherein a pressure at a position where the third exhaust port is provided is lower than a pressure in the first processing region and a pressure in the second processing region.

3. The film deposition apparatus as claimed in claim 1,
wherein the separation gas supply further includes a third discharge port, a fourth discharge port, and a supply controller, wherein the third discharge port is provided between the first discharge port and the third exhaust port in the circumferential direction of the rotary table, and the separation gas is discharged though the third discharge port, wherein the fourth discharge port is provided between the third exhaust port and the second discharge port in the circumferential direction of the rotary table, and the separation gas is discharged from the fourth discharge port, and wherein the supply controller is configured to control the supplying and stopping of the separation gas to be discharged from the first discharge port, the second discharge port, the third discharge port, and the fourth discharge port.

4. The film deposition apparatus as claimed in claim 1, wherein an exhaust path is connected to the third exhaust port, and an exhaust controller is provided in the exhaust path, the exhaust controller being configured to control an exhaust speed of the separation gas being exhausted from the third exhaust port.

5. The film deposition apparatus as claimed in claim 1, wherein the third exhaust port has a rectangular shape extending along a radial direction of the rotary table in plan view.

6. The film deposition apparatus as claimed in claim 1,
wherein the first processing region is an adsorption region where a source gas is adsorbed on each of the substrates, and wherein the second processing region is an oxidation region where the source gas adsorbed on each of the substrates is oxidized or a nitridation region where the source gas adsorbed on each of the substrates is nitrided.

7. The film deposition apparatus as claimed in claim 1,
wherein the second processing region is an adsorption region where a source gas is adsorbed on each of the substrates, and wherein the first processing region is an oxidation region where the source gas adsorbed on each of the substrates is oxidized or a nitridation region where the source gas adsorbed on each of the substrates is nitrided.

8. A film deposition method of depositing a film on a substrate mounted on a rotary table in a film deposition apparatus including:

a vacuum chamber;

the rotary table provided in the vacuum chamber, and configured to mount a plurality of substrates along a circumferential direction; and a first processing region, a separation region, and a second processing region provided in this order from an upstream side to a downstream side in a rotation direction of the rotary table, wherein a first process gas supply and a first exhaust port are provided in the first processing region, the first process gas supply being configured to supply a first process gas to the substrate, and the first exhaust port being configured to exhaust the first process gas supplied to the substrate, wherein a second process gas supply and a second exhaust port are provided in the second processing region, the second process gas supply being configured to supply a second process gas to the substrate, the second exhaust port being configured to exhaust the second process gas supplied to the substrate, wherein a separation gas supply and a third exhaust port are provided in the separation region, the separation gas supply being configured to supply a separation gas to separate the first process gas supplied to the first processing region and the second process gas supplied to the second processing region from each other, and the third exhaust port being configured to exhaust the separation gas supplied to the separation region, wherein the separation gas supply includes a first discharge port, a second discharge port, a third discharge port, a fourth discharge port, and a supply controller, wherein the first discharge port and the second discharge port are provided such that the third exhaust port is interposed between the first discharge port and the second discharge port in the circumferential direction of the rotary table, and the separation gas is discharged from the first discharge port and the second discharge port, wherein the third discharge port is provided between the first discharge port and the third exhaust port in the circumferential direction of the rotary table, and the separation gas is discharged from the third discharge port, wherein the fourth discharge port is provided between the third exhaust port and the second discharge port in the circumferential direction of the rotary table, and the separation gas is discharged from the fourth discharge port, wherein the supply controller is configured to control the supplying and stopping of the separation gas to be discharged from the first discharge port, the second discharge port, the third discharge port, and the fourth discharge port, wherein the first discharge port, the third exhaust port, and the second discharge port are provided in this order from the upstream side to the downstream side in the rotation direction of the rotary table, wherein an exhaust conductance from the first discharge port to the third exhaust port is less than an exhaust conductance from the first discharge port to a first end of the separation region, the first end being close to the first processing region, and wherein an exhaust conductance from the second discharge port to the third exhaust port is less than an exhaust conductance from the second discharge port to a second end of the separation region, the second end being close to the second processing region, the film deposition method comprising controlling the supply controller according to a condition of the depositing of the film to change a position to which the separation gas is supplied.

9. The film deposition method as claimed in claim 8, wherein the first processing region is an adsorption region where a source gas is adsorbed on the substrate, wherein the second processing region is an oxidation region where the source gas adsorbed on the substrate is oxidized or a nitridation region where the source gas adsorbed on the substrate is nitrided, and wherein the supply controller is controlled so that the separation gas is not discharged from the first discharge port and the second discharge port, and the separation gas is discharged from the third discharge port and the fourth discharge port.

10. The film deposition method as claimed in claim 8, wherein the second processing region is an adsorption region where a source gas is adsorbed on the substrate, wherein the first processing region is an oxidation region where the source gas adsorbed on the substrate is oxidized or a nitridation region where the source gas adsorbed on the substrate is nitrided, and wherein the supply controller is controlled so that the separation gas is not discharged from the third discharge port and the fourth discharge port, and the separation gas is discharged from the first discharge port and the second discharge port.

11. The film deposition method as claimed in claim 8, wherein an exhaust path is connected to the third exhaust port, and an exhaust controller is provided in the exhaust path, the exhaust controller being configured to control an exhaust speed of the separation gas from the third exhaust port, and wherein the exhaust controller is controlled according to the condition of the film deposition to change the exhaust speed of the separation gas being exhausted from the third exhaust port.

12. The film deposition method as claimed in claim 11, wherein the first processing region is an adsorption region where a source gas is adsorbed on the substrate, wherein the second processing region is an oxidation region where the source gas adsorbed on the substrate is oxidized or a nitridation region where the source gas adsorbed on the substrate is nitrided, and wherein the exhaust controller is controlled to stop exhaust of the separation gas from the third exhaust port.

13. The film deposition method as claimed in claim 11, wherein the second processing region is an adsorption region where a source gas is adsorbed on the substrate, wherein the first processing region is an oxidation region where the source gas adsorbed on the substrate is oxidized or a nitridation region where the source gas adsorbed on the substrate is nitrided, and wherein the exhaust controller is controlled to exhaust the separation gas from the third exhaust port.

\* \* \* \* \*